United States Patent [19]

Smith et al.

[11] Patent Number: 4,999,459
[45] Date of Patent: Mar. 12, 1991

[54] SEALING ENCLOSURES AGAINST ELECTROMAGNETIC INTERFERENCE

[75] Inventors: Kevin Smith, Munster Hamlet; Detlef Zimmermann, Nepean, both of Canada

[73] Assignee: Northern Telecom Limited, Montreal, Canada

[21] Appl. No.: 378,804

[22] Filed: Jul. 12, 1989

[51] Int. Cl.$^5$ ............................................... H05K 9/00
[52] U.S. Cl. .............................. 174/35 GC; 174/35 R; 219/10.55 D
[58] Field of Search .......... 174/35 GC, 35 R, 35 MS; 219/10.55 D, 10.55 R; 361/424

[56] References Cited

U.S. PATENT DOCUMENTS

| | | | |
|---|---|---|---|
| 3,240,862 | 3/1966 | Merkl | 174/35 MS |
| 3,889,043 | 6/1975 | Ducros | 174/35 GC |
| 3,969,572 | 7/1976 | Rostek | 174/35 MS |
| 4,652,695 | 3/1987 | Busby | 174/35 GC |

FOREIGN PATENT DOCUMENTS 1164533 3/1984 Canada .
1072751 2/1964 United Kingdom .

OTHER PUBLICATIONS

Bunk, Electromagnetic Shielding, Machine Design, Jul. 6, 1967.

Primary Examiner—Leo P. Picard
Assistant Examiner—Bot Lee Ledynh
Attorney, Agent, or Firm—Foley & Lardner

[57] ABSTRACT

A sealing arrangement for sealing a door or other closure against leakage of EMI (electromagnetic interference) from an enclosure comprises a flexible strip overlying a peripheral portion of the door. The flexible strip is attached to the door along its innermost edge. A magnet strip or the like urges the flexible strip into contact with the enclosure to be sealed. The magnet strip may be mounted on the closure, and trap the flexible strip against the frame, or be mounted upon the frame and pull the flexible strip onto the frame. Protuberances at intervals along the flexible strip provide reliable electrical contact between the flexible strip and the enclosure. The closure need not be a door, supported using hinges, but might be a panel supported solely by adhesion of the magnet strip to the enclosure. A plurality of such panels might be used to clad, and seal, an equipment rack of the open-framework kind. Electrical contact between adjacent panels may be by way of a contact member mounted on the frame, or by direct contact between the panels.

34 Claims, 4 Drawing Sheets

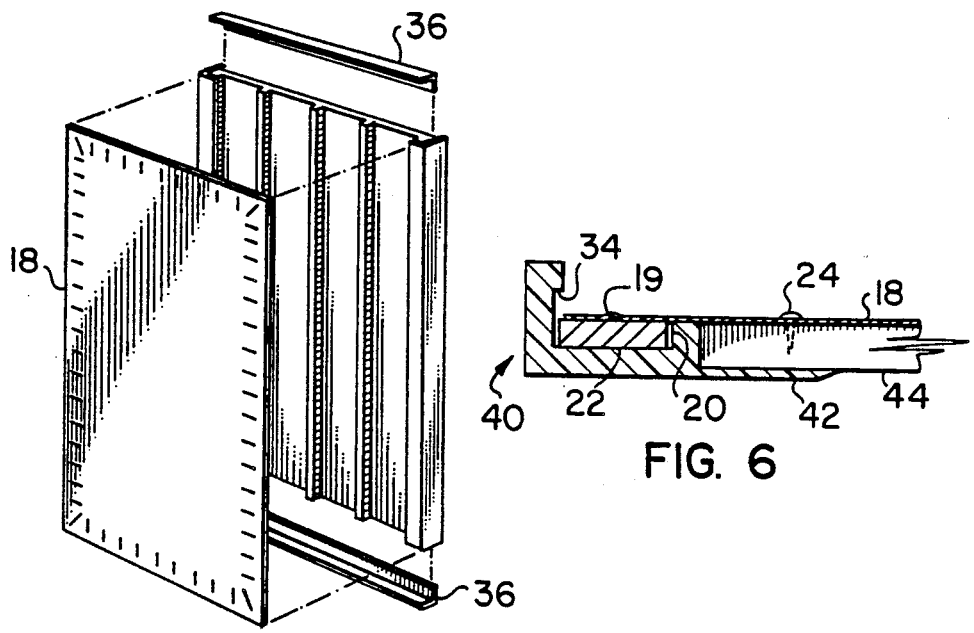
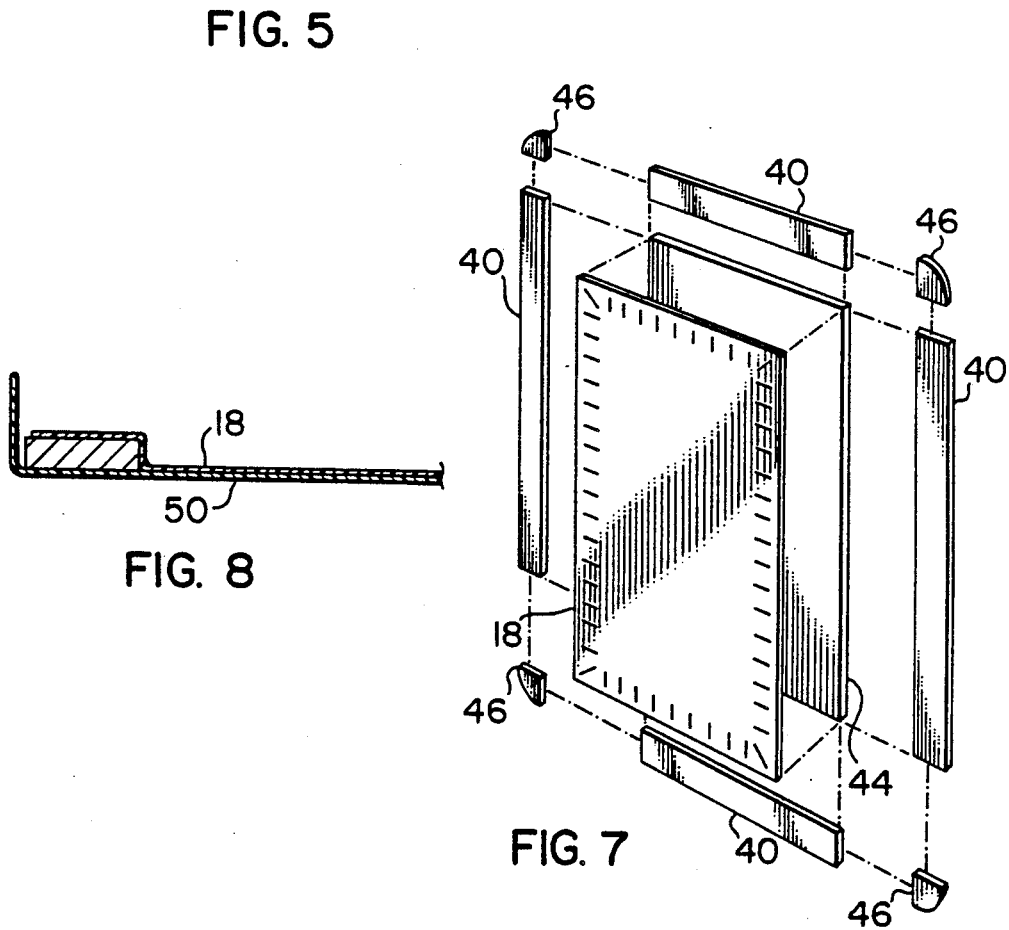

SEALING ENCLOSURES AGAINST ELECTROMAGNETIC INTERFERENCE

The invention relates to sealing arrangements for enclosures such as cabinets for housing electrical equipment and is especially concerned with sealing against EMI (electromagnetic interference) leakage between the enclosure frame and a door or other closure component.

BACKGROUND OF THE INVENTION

EMI gaskets used in electronic equipment include braided wire sheath, metal finger stock, and conductive foam. Braided wire sheath may be used with or without a foam core, but in either case requires a high compression force. This is a disadvantage since the door or closure must force the gasket against the equipment frame to provide a seal against EMI leakage. The greater the compression force to provide an effective seal, the greater the stiffness and precision of the door or closure must be. This leads to increased manufacturing costs. An example of such a braided wire sheath seal is disclosed in U.S. Pat. No. 4,652,695, which discloses a wire mesh covered resilient core having projecting edge margins of conductive mesh material gripped by a continuously extending flange.

Metal finger stock also requires high to medium compression forces. Conducting foam or conductive coated fabric with a foam core requires medium compression force and suffers the additional disadvantage that it is susceptible to compression set, i.e. the seal is unable to spring back fully to its original shape after prolonged compression.

One kind of seal, for the door of a microwave oven, is disclosed in Canadian patent number 1164533, issued Mar. 27, 1984. The microwave oven door is constructed from a metal screen/glass plate sandwich. Before assembly, the peripheral portion of the metal screen is inclined or offset at an angle to the glass plane. During assembly of the door, the offset portion is forced flat by the door frame as the glass plate and screen are inserted into the door frame. This causes the central portion of the screen to bow away from the glass plate. When the door is closed, the cabinet frame surrounding the door opening bears against the bowed screen. Because the screen is spaced from the glass, it can deform to conform to the cabinet frame.

This arrangement would not necessarily be satisfactory for a larger cabinet, such as might house telecommunications equipment, because it still relies upon the door to provide the force to conform the seal to the cabinet frame. The larger doors are more likely to twist or warp, so the space between the door and the cabinet is liable to vary, reducing the effectiveness of the seal. Moreover, the microwave oven operates at a single, high, frequency and so need only provide capacitive coupling to seal between the door and the cabinet. In telecommunications equipment and the like, the seal must be effective for frequencies ranging from a few hundred kilohertz to several gigahertz. At the lower frequencies, resistive coupling is also needed, so a metal-to-metal contact is required. Oxidation increases contact resistance, necessitating either high pressure sealed contacts or arrangements for providing a wiping action as the door is opened or closed. Wiping action contacts are not entirely satisfactory, especially if the cabinet door need not be opened regularly.

Another shielding arrangement for enclosures housing electronic assemblies is disclosed in U.S. Pat. No. 3,969,572, which shows an EMI gasket comprising an elongated laminar strip of plastics foam and flexible plastic permanent magnet strip. An electrically conductive strip is wrapped spirally around the core, compressing the foam. The strip is attached to one of the members to be sealed and a strip of magnetic material is attached to the other. The attractive force between the magnet and the magnetic material urges the spiral strip into contact with the magnetic material. Although this provides electrical contact and hence effective sealing at the lower frequencies, the spaces between adjacent turns of the spiral strip would reduce the capacitive coupling and hence reduce high frequency shielding. Also, the sealing strip would be relatively costly to make and mount. The stiffness of the connection members which extend perpendicular to the contact portion would likely limit compliance.

OBJECT OF THE INVENTION

An object of the present invention is to provide a coat effective sealing arrangement to reduce leakage of electromagnetic interference from enclosures housing electrical equipment.

Another object of the invention is to provide an electromagnetic interference sealing arrangement which requires relatively little change to the structure and the closure member.

SUMMARY OF THE INVENTION

According to one aspect of the present invention there is provided an enclosure having at least one opening and a closure therefor. The closure comprises a panel serving as a shield against electromagnetic radiation. A sealing arrangement, for sealing against electromagnetic radiation from the joint between the panel and the enclosure, comprises a conductive flexible membrane overlying at least a peripheral region of said panel so that, when said closure is closed, a strip of the membrane overlying the peripheral region will be sandwiched between the panel and the enclosure surrounding said opening. The flexible membrane is attached to the interior surface of said panel at a position spaced inwardly from said peripheral region, allowing the outer portion to flex away from the panel. The sealing arrangement further comprises magnet means for urging the outer portion of the flexible membrane into contact with the enclosure to seal said opening.

The magnet means may be mounted on the panel, between the peripheral portion of the panel and the outer portion of the flexible strip. In such embodiments, the flexible membrane is conductive and non-magnetic, conveniently a metal such as beryllium copper or phosphor bronze, so that the closing force exerted by the magnet means is not reduced by redirection of the magnetic flux.

The magnet means may comprises a magnetic strip disposed along the peripheral region and between the flexible strip and the closure. The magnetic strip may be housed loosely in a channel and the flexible strip may have enough resilience to restore the magnetic strip to its channel when the closure is opened.

Conversely, the magnet means might be provided on the enclosure, either housed in a channel, or attached to a frame member surrounding the opening to be sealed. The flexible membrane would then be of magnetic material so that it would be drawn into contact with the enclosure.

As mentioned previously, the effectiveness of the EMI seal for high frequencies depends upon the capacitance between the flexible strip and the enclosure. For lower frequencies, typically as low as a few hundred kilohertz, the resistance between the cabinet and the enclosure is a determining factor. Lower resistivity can be attained, together with better predictability, by providing a series of protuberances along the flexible strip and/or the abutting surface of the enclosure. It has been found that providing a protuberance every four inches, approximately, ensures a satisfactory contact resistance.

Conveniently, the flexible strip is about 5 or 6 thousands of an inch thick, which allows the magnet to conform the flexible strip to the enclosure surrounding the opening. At the same time the flexible strip remains stiff enough to restore the magnet to its initial position when the closure is opened.

The closure may be a door, hinged in a conventional manner. Alternatively, the closure may be a removable panel and be attached to an equipment frame by means of the magnetic strip. In this case the panel conveniently is a lightweight plastics moulding lined with a metal screening membrane, the flexible strip being provided around, and connected electrically to, the periphery of the screen. The flexible strip may be an integral part of the screening membrane and conveniently be slotted to facilitate conformance with irregular surfaces.

According to a second aspect of the invention there is provided a closure panel, for sealing an enclosure opening against electromagnetic radiation, comprising a panel adapted to shield electromagnetic radiation, a conductive flexible strip overlying a peripheral region of said panel and attached at its innermost margin to said panel, and means for urging said flexible strip away from said panel and into contact with said enclosure.

BRIEF DESCRIPTION OF THE DRAWINGS

FIG. 5 is an exploded view of the door or panel of FIG. 4;

FIG. 6 is a sectional view illustrating yet another door or panel using extruded parts and flat sheet material;

FIG. 7 is an exploded view of the door or panel of FIG. 6;

FIG. 8 is a sectional view of still another door or panel;

DETAILED DESCRIPTION OF PREFERRED EMBODIMENTS

Figure 1:
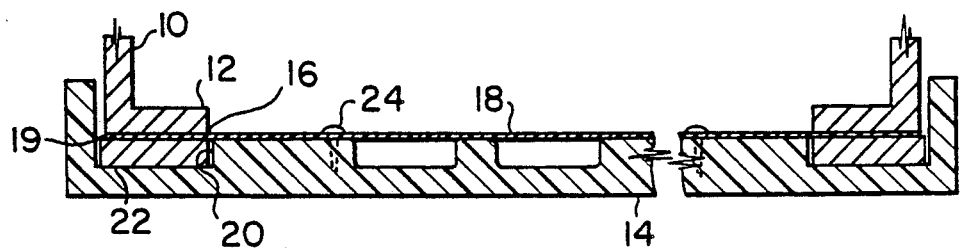
FIG. 1 is a cross section through a portion of an enclosure and door or panel when the latter is closed.

Referring to FIG. 1, an enclosure, in the form of a cabinet, has a sidewall 10 with a flange 12 extending perpendicular to the sidewall 10 to serve as the jamb of an opening in the cabinet. A closure, door 14, extends across the opening with its peripheral region 16 overlying the jamb 12. A thin flexible metal lining 18 extends across the entire interior surface of the door 14, including the peripheral region 16. The metal lining 18 is attached to the door 14 by a series of rivets 24, arranged in a row extending parallel to, and spaced inwardly from, the edge of the door 14. The strip 19 of lining 18 that is outside the row of rivets i.e. overlying the peripheral region 16, is not attached to the underlying door surface and so may be flexed away from the door 14.

A channel 20 extends along the peripheral region and parallel to the edge of the door 14. A strip magnet 22 rests loosely in the channel 20 and in alignment with flange 12. The magnet 22 is retained in the channel 20 by the flexible strip 19 that overlies the magnet.

The flange 12 is of magnetic material, for example chromated steel. When the door is being closed, the magnet 22 will be attracted to the flange 12, urging the flexible metal strip 19 into contact with the flange 12.

Figure 2:
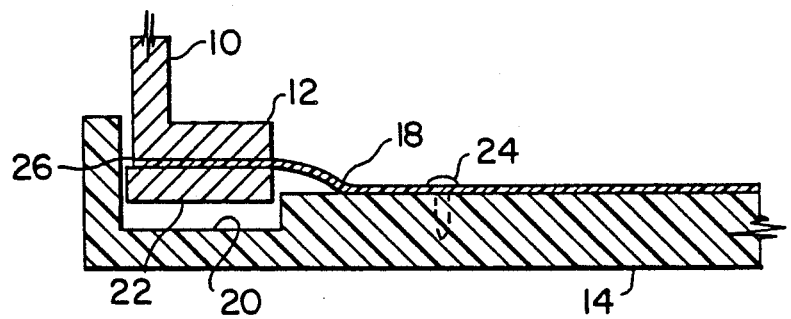
FIG. 2 corresponds to FIG. 1 but shows the door or panel partially open or taking up warp/irregularities.

Referring to FIG. 2, as the door 14 starts to open, the magnet 22 remains attracted to the flange 12 of the cabinet and so lifts a short distance out of the groove 20. As the door 14 continues to open, the restoring force exerted by flexible strip 19 will eventually overcome the magnetic attraction and pull the magnet 22 away from the flange 12. The spacing of the rivets 24 laterally of the groove 20 provides leverage to assist in pulling the magnet 22 away from the flange 12. Thus, as the door opens, the flexible metal strip 19 at first will flex, then cause the magnet 22 to pivot around its outer edge—the pivot point referenced 26 in FIG. 2. This flexing and pivoting sequence provides a gradual release, an effect that connotes a quality product, rather than an abrupt, jerky release of the magnet 22.

Figure 3:
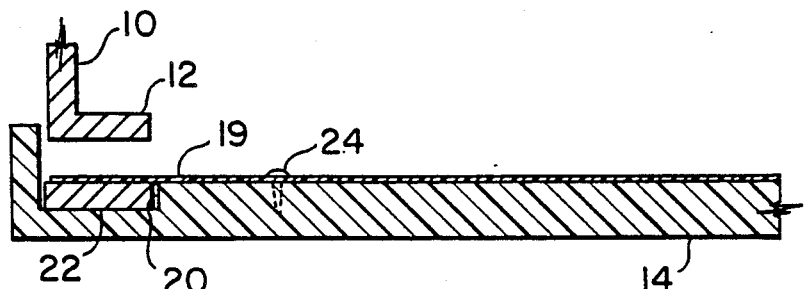
FIG. 3 shows the door or panel open.

Once the magnet 22 has released from the flange 12, it will be returned, by the flexible strip 19, to its initial position at the bottom of channel 20—as illustrated in FIG. 3.

It has been found that a sealing arrangement as disclosed herein can provide a closing force of about 5 ounces per inch or about 3.75 lbs per foot. The magnet 22 will actually try to close up any mechanical gaps between the door structure and the frame and so will accommodate deviations and inaccuracies, such as panel or door twist or warp.

It should be appreciated that if the magnet 22 and the flexible strip 19 were fastened rigidly to the door, the latter would have to be flexible enough to bend to take up any frame curvature in order to maintain an adequate seal. With embodiments of the present invention the stiffness required need only be sufficient to open the door. If the door structure is rigid, the magnet and flexible metal strip combination will move to take up the tolerances.

Flexibility of the flexible strip 19 may be enhanced by a series of parallel slits, each extending across a major part of the width of the strip.

Preferably movement of the magnetic strip should be limited so that it will not turn on edge and wedge the metal strip in a permanently outwardly-deflected mode. Hence the compliance of the seal is a function of magnet movement control and allowable flex in metal strip material.

It is envisaged that a mechanical detent might be provided to prevent excess movement of the magnet 22. For example, both the magnet 22 and channel 20 might have lips forming stoops to cooperate and limit travel of the magnet 22 out of the channel 20.

Figure 4:
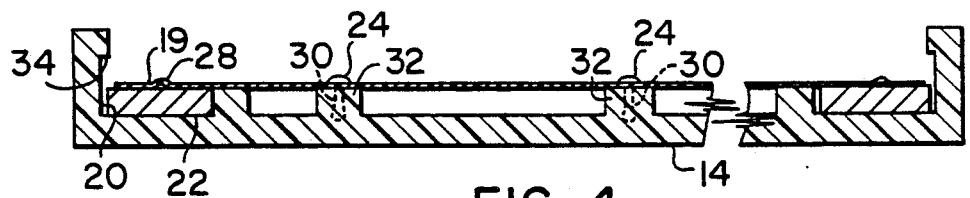
FIG. 4 is a sectional view illustrating an alternative door or panel construction.

Referring to FIG. 4, a series of protuberances 28 are provided along the length of the flexible strip 19 where it is to contact the flange 12. Protuberances 28 spaced at approximately four inch intervals have been found to give adequately low resistance and hence adequate low frequency performance.

Because the flexible strip 19 is very flexible and is held in close proximity to the cabinet by the magnet 22, relatively small spacing is attainable. This ensures a relatively high capacitance between the flexible strip 19 and the cabinet flange 12, which affords improved shielding performance at high frequencies.

An advantage of embodiments of the invention is that the seal is maintained without any contribution of force by the door or closure, which simplifies design. The relatively large, flat mating surface provides non-critical alignment. Long term reliability is possible because there are no components that take a compression set. The arrangement is relatively simple and hence less costly than other approaches.

FIGS. 4, 5, 6, 7 and 8 illustrate alternative constructions for a door. Parts corresponding to those in FIG. 1 have the same reference numerals.

FIG. 4 shows a door 14 formed as an extrusion with grooves 30 in ribs 32. The screws or rivets 24 are driven into the grooves 30 to secure the flexible lining 18 to the door panel. The channel 20 housing the magnet 22 is formed between the two endmost ribs. An inwardly-projecting lug 34 on one rib serves as a stop to limit movement of the magnet 22 as intimated previously. The extruded panel is capped at each end by capping pieces 36 and the lining sheet 18 is then applied to its surface as shown in FIG. 5.

FIGS. 6 and 7 show a door which, in effect, is of so-called panelled-door construction. An extruded edge member 40 has a recess forming channel 20 housing a magnet 22 and a flange 42 extending towards the middle of the door. A panel 44 fits into a recess forming flange 42 and carries the flexible lining 18. As shown in FIG. 7, similar edge extrusions 40 are provided for the other edges of the panel 44 and corner pieces 46 finish the corners.

FIG. 8 illustrates a door panel formed by a vacuum-formed outer shell 50. The flexible lining sheet 18 is adhered to the interior surface of the outer shell 50. Instead of a channel for the magnet 22, the lining 18 is stepped to form the flexible strip portion 19 which extends over the magnet 22. The adhesive secures the lining 18 to the medial portion of the door panel, but allows the flexible strip portion 19 to lift away from the outer shell 50.

Instead of relying on the flexible strip 19 to restrain and restore the magnet to its original position, an alternative restoring means could be provided, perhaps within the channel 20 itself, enabling the flexible strip to be thinner. It will be appreciated that the flange 12 itself should be conductive. It has also been found that the protuberances provide a reliable contact over a prolonged time, unlike some finger stock gaskets intended to give resistive/capacitive coupling, but which deteriorate over a period of time due to an accumulation of oxides, necessitating a wiping action to penetrate any oxide build-up.

Embodiments of the present invention provide satisfactory EMI shielding over a relatively large range of frequencies from a few hundred kilohertz to as much as a 1.5 GHz.

Figure 9:
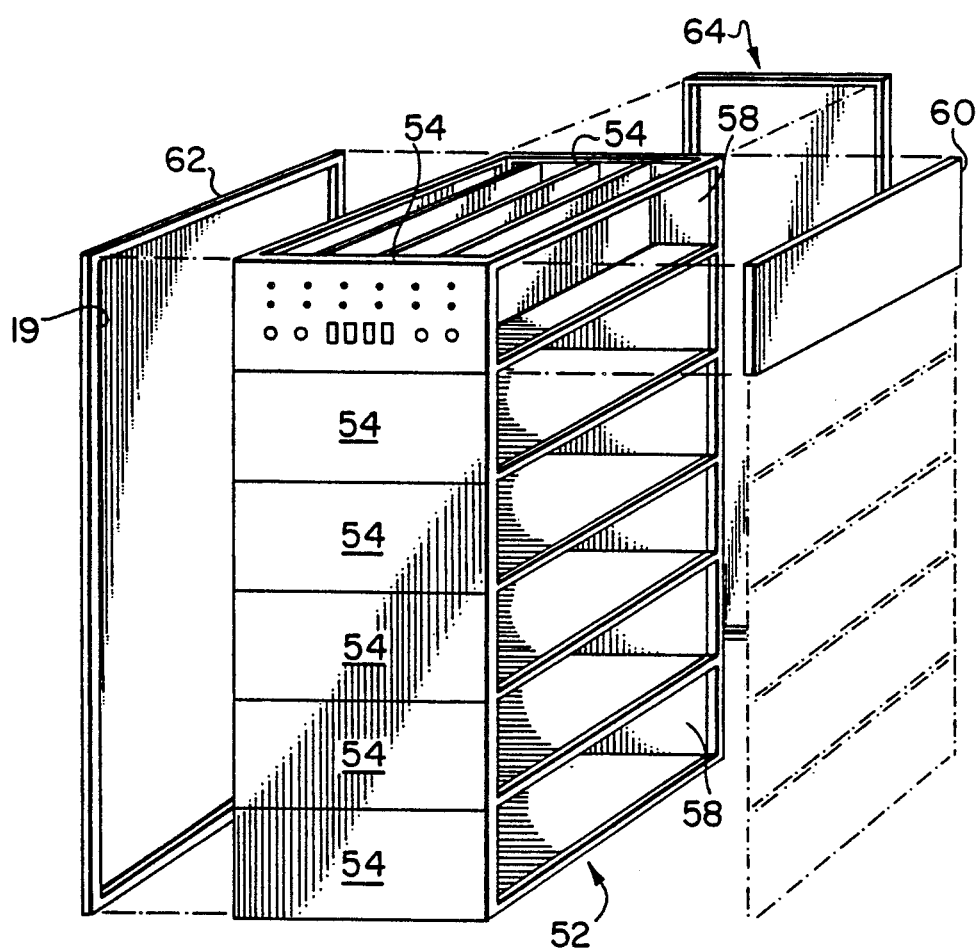
FIG. 9 is an exploded view of an equipment rack comprising an open frame, and a set of closure panels, and a door panel.

One of the main applications of the invention will be for sealing around doors fitted to metal cabinets. It is also envisaged, however, that equipment racks could be sealed by fitting them with a suitable number of panels embodying the present invention. Such an equipment rack is illustrated in FIG. 9 and comprises an open rack or framework 52 of steel box-section material. A set of front panels 54 are provided at the front of the rack, one for each "drawer". Printed circuit cards 56 are mounted between each front panel 54 and a corresponding backplane 58. One side of the rack 52 is clad with a set of panels 60, one for each opening in the rack 52. Each panel 60 comprises a slab of lightweight plastics material, for example polystyrene, with a metal lining, a peripheral flexible strip, and a magnet strip (not shown in FIG. 9) as previously described. Each panel 60 is dimensioned such that its flexible strips will align with the frame members surrounding the opening so that the underlying magnetic strip will adhere thereto. Because the panels 60 are of lightweight material, the magnetic strips will hold each panel 60 securely to the framework 52. No additional fasteners are needed.

The panels may be any suitable size, providing their edges will align with frame members. By way of illustration, the opposite side of the equipment rack 52 is shown clad with a single panel 62, of similar construction to the panels 60, with its magnet strips aligned with the top and bottom rails, respectively, of the rack 52. At the rear, the equipment rack 52 is fitted with a door 64, which may be of similar construction to those described hereinbefore.

The magnet means may be provided on the enclosure frame rather than on the closure panel which could further reduce the weight of the closure panel. Such an alternative is illustrated in FIGS. 10, 11, 12 and 13.

Figure 10:
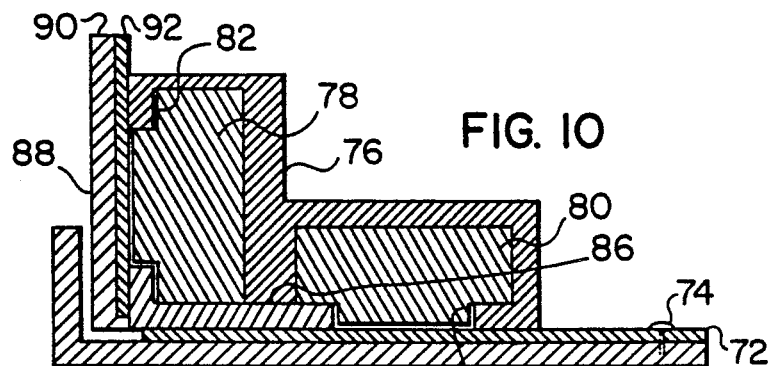
FIGS. 10 to 13, inclusive, are sectional detail views of alternative sealing arrangements.

In FIG. 10, a moulded door panel 70 is shown with its interior lined with a metal film 72 which serves as a radiation screen. The metal film 72 is attached to the door panel 70 by screws or rivets 74 spaced inwardly from the contact region. The enclosure framework comprises a frame member 76 which has magnet strips 78 and 80 housed in longitudinal channels 82 and 84, respectively. The channels 82 and 84 are disposed one on each outwardly facing surface of the frame member 76. A contact strip 86 of electrically conductive material extends between the magnet strips 78 and 80 and around the corner of the frame member 76.

The door panel 70 is attached to the frame member 76 by the magnetic attraction between metal screening film 72 and the magnet strip 80. A side panel 88 is of similar construction to door panel 70 in that it is formed by a moulding 90 with a metal lining 92 on the inner face. The side panel 88 is attached to magnet strip 78. The surfaces of magnet strips 78 and 80 are arranged to lie slightly below the surface of the frame member 76 to ensure that the metal films 72 and 92, respectively, will be pressed onto the contact strip 86 and make good electrical contact.

Figure 11:
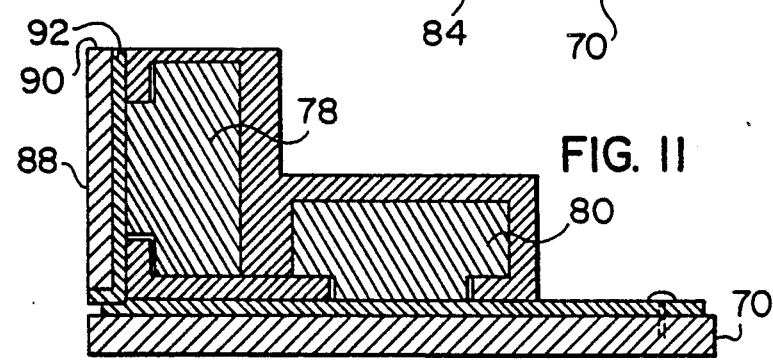

In FIG. 11, which shows a modification of the enclosure of FIG. 10, in which parts corresponding to FIG. 10 have the same reference numeral. The modification comprises extending metal film 92 around the edge of the side panel 88 as at 94 and extending the metal film 72 on door panel 70 beyond the edge of frame member 76. The edge of side panel 88 protrudes a little way beyond the frame member 76 so that, when the door panel is pulled into contact with the magnet strip 80 good electrical contact will be made between the metal film 72 and the metal film portion 94. In this embodiment the electrical contact is made directly between the door panel 70 and the side panel 88. Consequently, the contact strip 86 of the FIG. 10 embodiment is omitted.

Figure 12:
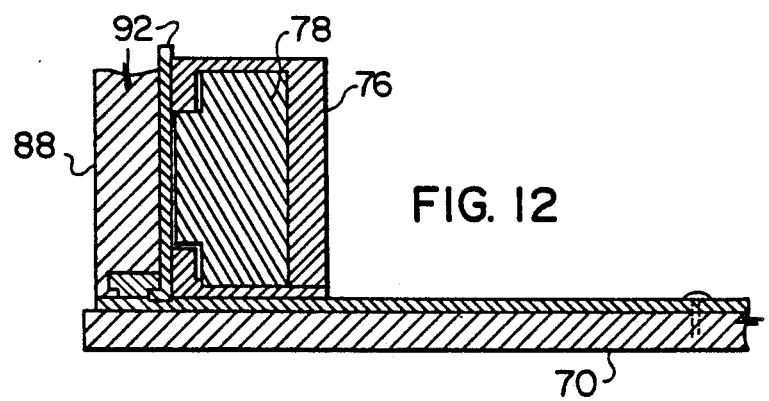

FIG. 12 shows yet another embodiment which has a magnet strip 78 housed in a channel 82 in the frame member 76. The door panel 70 and the side panel 88 correspond generally with those shown in FIG. 11, but side panel 88 differs in that it has a magnet strip 96 housed in a channel extending along its edge. The arrangement is such that the side panel 88 will be attached to the magnet strip 78 in the usual way and the door panel 76 will be attached by means of the metal film 72 adhering to the magnet strip 96. As before, the metal film 92 on the side panel 88 wraps around the edge of the side panel 88 and is abutted by the metal film 72 on the door panel 70. Good electrical contact is assured by arranging for the edge portion of metal film 92 to protrude beyond the magnet strip 96 and the frame member 76 when the side panel 88 is attached.

Figure 13:
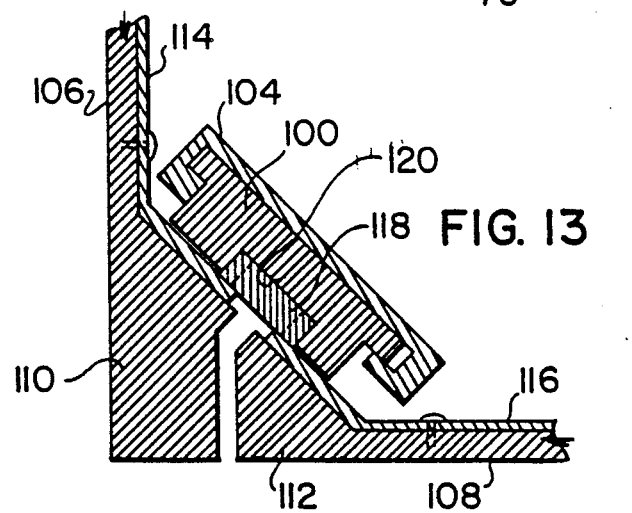

The embodiment illustrated in FIG. 13 uses a single magnet strip 100 housed in a channel 102 in a frame member 104. The magnet strip 100 is positioned with its face at an oblique angle to the front and side surfaces of the enclosure. A door panel 106 and a side panel 108 are similar to each other and comprises moulded panels having flanges 110 and 112 along their respective edges and metal linings 114 and 116, respectively. Each of the flanges 110 and 112 extends obliquely relative to the associated panel at an angle corresponding to that of the magnet strip 100, vis. 45 degrees.

As illustrated in FIG. 13, the door panel 106 and side panel 108 are attached to the frame member 104 by attaching the portions of the metal films 114 and 116 to the single magnet strip 100. A contact strip 118, of copper, phosphor bronze or other suitable conductive material, is located in a longitudinal channel 120 in the outer face of magnet strip 100. The contact strip 118 bridges between the metal film 114 and 116 to connect the door panel 106 and side panel 108 together electrically. The contact strip 18 may project beyond the surface of the magnet strip 100 to ensure good electrical contact.

An advantage of embodiments of the invention is that the flexible strip need not be particularly resilient and so may be made from cheaper material than, say, beryllium copper.

An advantage of magnetically-attached cladding panels is that they are quick and easy to retrofit to existing equipment racks. Moreover, they are quick and easy to remove for access to the equipment within since a limited number of permanent fasteners, (if any), are required.

We claim:

1. An enclosure having at least one opening and a closure therefor, and a sealing arrangement for sealing against electromagnetic radiation from a joint between the closure and the enclosure, said closure comprising a panel and a shield comprising a film of electrically conductive material extending over a face of said panel, said sealing arrangement comprising a conductive flexible strip overlying a peripheral region of said closure such that the strip will be sandwiched between the closure and the enclosure surrounding said opening when said closure is closed, said flexible strip comprising a margin of said film of electrically conductive material, an edge of said conductive flexible strip being attached to a surface of said closure at a position spaced inwardly from said peripheral region, said sealing arrangement further comprising magnet means for urging said flexible strip into contact with the enclosure to seal said opening.

2. An enclosure as defined in claim 1, wherein said magnet means comprises a magnet strip extending around the periphery of said closure and said film is stepped to extend over and retain said magnet strip, said film being attached medially to said panel so as to permit limited movement of said magnet away from said panel.

3. An enclosure as defined in claim 2, wherein said magnet means extends around the periphery of said closure and between said flexible strip and said closure, said magnet means serving to urge said flexible strip against a corresponding frame member of said enclosure both to seal against electromagnetic radiation and to secure said closure to said frame member.

4. An enclosure as defined in claim 1, wherein said flexible strip further comprises a plurality of protuberances spaced apart along the length thereof and projecting out of the plane of said margin to contact said enclosure when said closure is closed.

5. An enclosure as defined in claim 1, wherein the portion of said electrically conducting material overlying said peripheral region comprises a free edge of said flexible strip, and wherein said magnet means comprises a magnetic member which is located between said panel and said flexible strip and which urges said free edge of said flexible strip into contact with said enclosure.

6. An enclosure having at least one opening and a closure therefor, said closure comprising a shield against electromagnetic radiation, and a sealing arrangement for sealing against electromagnetic radiation through a joint between the closure and the enolosure, said sealing arrangement comprising a flexible strip of conductive film overlying a peripheral region of said closure such that the film will be sandwiched between the closure and the enclosure surrounding said opening when said closure is closed, and magnet means for urging said flexible strip into contact with the enclosure to seal said opening, said flexible strip having one edge attached to a surface of said closure and being coupled electrically to said shield, said flexible strip further comprising a plurality of protuberances spaced apart along the length of said flexible strip and projecting out of the plane of said flexible strip to contact the enclosure when the closure is closed.

7. An enclosure as defined in claim 1 or 6, wherein said magnet means comprises a magnet strip extending around the periphery of said closure and between the flexible strip and said closure.

8. An enclosure as defined in claim 7, wherein said magnet strip is movable away from said closure and said flexible strip is resilient so as to return the magnetic strip when the closure is spaced from said enclosure.

9. An enclosure as defined in claim 7, wherein said magnet strip is accommodated in a channel in said closure.

10. An enclosure as defined in claim 9, wherein said channel comprises a stop to limit movement of said magnet strip.

11. An enclosure as defined in claim 7, wherein said closure comprises an extruded panel having a plurality of ribs, said magnet strip being housed in a channel between two such ribs.

12. An enclosure as defined in claim 7, wherein said closure comprises an assemblage of a panel and a plurality of recessed edge members, each having a first recess to cooperate with an edge of said panel, and a second recess to accommodate said magnet strip.

13. An enclosure as defined in claim 1 or 6, wherein said flexible strip is of magnetic material and said magnet means comprises a magnet strip extending around the periphery of said opening and serving to pull said flexible strip into contact with said enclosure.

14. An enclosure as defined in claim 13, wherein said magnet means comprises a pair of magnets mounted to a corner of a frame member of said enclosure, one of said magnets presenting a surface to one face of said enclosure and the other of said magnets presenting a surface to an adjacent face, and a contact member extending between said magnets to interconnect electrically a pair of said closures attached to said faces of said enclosure.

15. An enclosure as defined in claim 13, wherein said magnet means comprises a pair of magnets mounted to a corner of a frame member of said enclosure, one magnet presenting a surface to one face of said enclosure and the other magnet presenting a surface to an adjacent face, and a pair of closures attached to said enclosure with their respective edge portions abutting said corner, the conductive flexible strips of the two closures contacting each other.

16. An enclosure as defined in claim 13, and a pair of said closures attached to said enclosure with their respective edge portions abutting at a corner thereof, said magnet means comprising a first magnet mounted to said enclosure, one of said closures being attached by said first magnet, and a second magnet mounted to an edge of said one of said closures to extend longitudinally thereof, the other of said closures projecting across said edge of said one closure and being supported by said second magnet, the conductile flexible strip of said one closure extending at least to the edge of said one closure so as to contact the conductive flexible strip of said other closure.

17. An enclosure as defined in claim 13, and a pair of said closures attached to said enclosure at a corner thereof, said magnet means being mounted to said enclosure so as to present a surface extending obliquely between the faces of the enclosure conjoined by said corner, a contact member extending longitudinally and centrally of said surface, said peripheral region of each closure extending in a plane extending substantially parallel to said surface of said magnet means, such that when each said conductive flexible strip is attached to the underlying portion of said magnet means such strip also contacts said contact member.

18. An enclosure as defined in claim 1 or 6, comprising an open framework having a plurality of openings defined by frame members and a corresponding plurality of said closures, each closure being attached to said framework so as to extend between said members of said framework and cover the opening therebetween.

19. An enclosure as defined in claim 1 or 6, wherein said flexible strip is beryllium-copper.

20. A closure for sealing an enclosure opening against electromagnetic radiation, comprising a panel and a shield comprising a film of electrically conductive material extending over a face of said panel, margins of said film comprising a flexible strip overlying at least a peripheral region of said panel, an edge of said flexible strip being attached to said panel at a position spaced inwardly of said peripheral region, said closure further comprising magnet means for urging said flexible strip away from said panel and into contact with said enclosure.

21. A closure as defined in claim 20, further comprising a plurality of protuberances spaced apart along the length of said flexible strip and projecting out of the plane of said strip so as to contact said enclosure when said closure is closed.

22. A closure for sealing an enclosure opening against electromagnetic radiation, comprising a panel and a flexible strip of conductive film overlying at least a peripheral region of said panel, an edge of said strip being attached to said panel at a position spaced inwardly of said peripheral region, said flexible strip further comprising a plurality of protuberances spaced apart along the length of said flexible strip, and magnet means for urging said flexible strip away from said panel so as to bring said protuberances into contact with the enclosure when the closure is closed.

23. A closure as defined in claim 20 or 22, wherein said flexible strip is of beryllium-copper.

24. A closure as defined in claim 20 or 22, wherein said magnet means extends around the periphery of said closure and between said flexible strip and said panel.

25. A closure as defined in claim 24, wherein said closure comprises an extrusion having a plurality of ribs, said magnet means being accommodated in a channel between two such ribs.

26. A closure as defined in claim 24, wherein said closure comprises an assemblage of a panel and a plurality of recessed edge members, each such edge member having a first recess to cooperate with an edge of said panel, and a second recess to accommodate said magnet means.

27. A closure panel as defined in claim 24, wherein said film is stepped to extend over and retain said magnet means, said film being attached to a medial area of the shell, the arrangement being such as to permit limited movement of said magnet means away from said panel.

28. A closure as defined in claim 24, wherein said magnet means is movable away from said closure and said flexible strip is so resilient as to return said magnetic means towards said closure.

29. A closure as defined in claim 28, wherein said magnet means comprises a magnet strip accommodated in a channel in said closure.

30. A closure as defined in claim 29, wherein said channel comprises a stop to limit movement of said magnet strip.

31. An enclosure having a pair of openings and a corresponding pair of closures therefor, each of said closures comprising a shield against electromagnetic radiation, and a sealing arrangement for sealing against electromagnetic radiation from a joint between the closure and the enclosure, said sealing arrangement comprising a conductive flexible strip overlying a peripheral region of said closure and attached to the interior surface of said closure at a position spaced inwardly from said peripheral region, such that the strip will be sandwiched between the closure and the enclosure surrounding said opening when said closure is closed, said conductive flexible strip being of magnetic material, said enclosure comprising a magnet strip extending around the periphery of each said opening and serving to pull a corresponding said flexible strip into contact with said enclosure to seal said opening, wherein a pair of said magnet strips are mounted to a corner of a frame member of said enclosure, one of said magnets presenting a surface to one face of said enclosure and the other of said magnets presenting a surface to an adjacent face, and a contact member extends between said magnets to interconnect electrically a pair of said closures attached to said faces of said enclosure.

32. An enclosure having a pair of openings and a corresponding pair of closures therefor, each of said closures comprising a shield against electromagnetic radiation, and a sealing arrangement for sealing against electromagnetic radiation from a joint between the closure and the enclosure, said sealing arrangement comprising a conductive flexible strip overlying a peripheral region of said closure and attached to the interior surface of said closure at a position spaced inwardly from said peripheral region, such that the strip will be sandwiched between the closure and the enclosure surrounding said opening when said closure is closed, said conductive flexible strip being of magnetic material, wherein said enclosure comprises a pair of magnets mounted to a corner of a frame member of said enclosure, one magnet presenting a surface to one face of said enclosure and the other magnet presenting a surface to an adjacent face, and a pair of closures attached to said enclosure with their respective edge portions abutting said corner, the conductive flexible strips of the two closures contacting each other.

33. An enclosure having a pair of openings and a corresponding pair of closures therefor, each of said closures comprising a shield against electromagnetic radiation, and a sealing arrangement for sealing against electromagnetic radiation from a joint between the closure and the enclosure, said sealing arrangement comprising a conductive flexible strip overlying a peripheral region of said closure and attached to the interior surface of said closure at a position spaced inwardly from said peripheral region, such that the strip will be sandwiched between the closure and the enclosure surrounding said opening when said closure is closed, said conductive flexible strip being of magnetic material, a pair of said closures being attached to said enclosure with their respective edge portions abutting at a corner thereof, said enclosure comprising a first magnet mounted to said enclosure, one of said closures being attached by said first magnet, and a second magnet mounted to an edge of said one of said closures to extend longitudinally thereof, the other of said closures projecting across said edge of said one closure and being supported by said second magnet, the conductive flexible strip of said one closure extending at least to the edge of said one closure so as to contact the conductive flexible strip of said other closure.

34. An enclosure having a pair of openings and a corresponding pair of closures therefor, each of said closures comprising a shield against electromagnetic radiation, and a sealing arrangement for sealing against electromagnetic radiation from a joint between the closure and the enclosure, said sealing arrangement comprising a conductive flexible strip overlying a peripheral region of said closure and attached to the interior surface of said closure at a position spaced inwardly from said peripheral region, such that the strip will be sandwiched between the closure and the enclosure surrounding said opening when said closure is closed, said conductive flexible strip being of magnetic material, a pair of said closures being attached to said enclosure at a corner thereof, said enclosure comprising magnet means mounted at a corner of said enclosure so as to present a surface extending obliquely between the faces of the enclosure conjoined by said corner, a contact member extending longitudinally and centrally of said surface, said peripheral region of each closure extending in a plane extending substantially parallel to said surface of said magnet means, such that when each said conductive flexible strip is attached to the underlying portion of said magnet means such strip also contacts said contact member.

* * * * *